US009343610B2

(12) United States Patent
Palm et al.

(10) Patent No.: US 9,343,610 B2
(45) Date of Patent: May 17, 2016

(54) DEVICE AND METHOD FOR PRECIPITATING A LAYER ON A SUBSTRATE

(71) Applicant: SAINT-GOBAIN GLASS FRANCE, Courbevoie (FR)

(72) Inventors: Joerg Palm, Munich (DE); Stephan Pohlner, Munich (DE); Stefan Jost, Munich (DE); Thomas Happ, Munich (DE)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 0 days.

(21) Appl. No.: 14/487,805

(22) Filed: Sep. 16, 2014

(65) Prior Publication Data

US 2015/0072460 A1 Mar. 12, 2015

Related U.S. Application Data

(62) Division of application No. 13/580,241, filed as application No. PCT/EP2011/052609 on Feb. 22, 2011.

(30) Foreign Application Priority Data

Feb. 23, 2010 (EP) .................................... 10154378

(51) Int. Cl.
*H01L 21/00* (2006.01)
*H01L 31/18* (2006.01)
(Continued)

(52) U.S. Cl.
CPC ............ *H01L 31/18* (2013.01); *C23C 14/0617* (2013.01); *C23C 14/0623* (2013.01);
(Continued)

(58) Field of Classification Search
CPC . H01L 27/142; H01L 31/046; H01L 31/0445; H01L 31/0284; H01L 31/02168
USPC .............................. 438/57, 66, 758, 765, 767
See application file for complete search history.

(56) References Cited

U.S. PATENT DOCUMENTS 4,642,227 A * 2/1987 Flagan et al. ................. 423/349
6,299,746 B1 10/2001 Conte et al.
(Continued)

FOREIGN PATENT DOCUMENTS

EP 0 926 258 6/1999
EP 1 382 714 1/2004

OTHER PUBLICATIONS

International Search Report Issued May 2, 2011 in PCT/EP11/52609 Filed Feb. 22, 2011.
English Translation of the International Preliminary Report on Patentability and Written Opinion issued Aug. 28, 2012 in PCT/EP2011/052609.

*Primary Examiner* — Brook Kebede
(74) *Attorney, Agent, or Firm* — Oblon, McClelland, Maier & Neustadt, L.L.P.

(57) ABSTRACT

The invention relates to a device for depositing a layer made of at least two components on an object, with a deposition chamber for disposing the object, at least one source with material to be deposited, as well as at least one device for controlling the deposition process, implemented such that the concentration of at least one component of the material to be deposited can be modified in its gas phase prior to deposition on the substrate by selective binding of a specified quantity of the at least one component, wherein the selectively bound quantity of the at least one component can be controlled by modifying at least one control parameter that is actively coupled to a binding rate or the component. It further relates to a device for depositing a layer made of at least two components on an object, wherein a device for controlling the deposition process has at least one gettering element made of a reactive material, wherein the reactive material includes copper and/or molybdenum. It further relates to a method for depositing a layer made of at least two components on an object, wherein a selectively bound quantity of at least one component is controlled by modifying a binding rate of a device for controlling the deposition process.

7 Claims, 5 Drawing Sheets

(51) Int. Cl.
  *C23C 14/06* (2006.01)
  *C23C 14/54* (2006.01)
  *C23C 14/56* (2006.01)
  *C23C 16/44* (2006.01)
  *C30B 23/00* (2006.01)
  *C30B 29/48* (2006.01)

(52) U.S. Cl.
  CPC ............... *C23C14/54* (2013.01); *C23C 14/564* (2013.01); *C23C 16/4412* (2013.01); *C30B 23/005* (2013.01); *C30B 29/48* (2013.01)

(56) References Cited

U.S. PATENT DOCUMENTS

| | | | |
|---|---|---|---|
| 6,508,632 | B1 | 1/2003 | Conte et al. |
| 7,375,011 | B1 * | 5/2008 | Kahen .......................... 438/502 |
| 2004/0016443 | A1 | 1/2004 | Sasaki |
| 2005/0042376 | A1 | 2/2005 | Xin et al. |
| 2008/0118779 | A1 | 5/2008 | Noma |
| 2013/0029479 | A1 | 1/2013 | Jost et al. |
| 2013/0067723 | A1 | 3/2013 | Palm et al. |

\* cited by examiner

DEVICE AND METHOD FOR PRECIPITATING A LAYER ON A SUBSTRATE

CROSS REFERENCE TO RELATED APPLICATIONS

The present application is a divisional of U.S. patent application Ser. No. 13/580,241, filed on Oct. 25, 2012, which is a 35 U.S.C. §371 national stage patent application of international patent application PCT/EP11/052609, filed on Feb. 22, 2011, which claims priority to European patent application 10 154 378.3, filed on Feb. 23, 2010.

The invention is in the technical field of production of layer systems, in particular with thin layers, and relates to devices and a method for depositing a layer made of at least two components on a substrate.

The electronic and structural properties of semiconductor layers made of multiple components (e.g., CdS, $Cu_2S$, $Cu_x Se_y$, $In_x S_y$, $In_x Se_y$, ZnS, GaAs, etc.) are strongly determined by the composition of the layer. In the case of layer deposition, e.g., by PVD processes (physical vapor deposition, physical deposition of thin layers, e.g., thermal evaporation, electron beam evaporation, sputtering), the composition of the layer can deviate from the composition of the starting material, in particular when the compound dissociates in the gaseous state. Due to different characteristics of the components (such as mass, chemical reactivity, melting point), the layer can, through loss of a component on the way from the source to the substrate, have a different composition from the starting material. Even the starting material can already have a different composition from the optimal composition desired for the application.

The following terms are used hereinafter:

"Evaporation rate" refers to the flow of material directly out of the source. The "rate of deposition" characterizes the quantity of substance that is deposited onto the substrate per unit of time. The "binding rate", or "getter rate", refers, on the other hand, to the quantity of the material that is extracted from the gas phase by a reactive or inert surface.

Compounds made of multiple components (compound semiconductors) can be deposited as thin films by extremely varied methods. In the case of thermal evaporation, so-called "co-evaporation" (evaporation of individual components, e.g., for production of a chalcopyrite absorber made of Cu, In, Ga, and Se) is used. However, in order to generate layers of high material quality, the substrate must be held at high temperatures (>400° C.). In particular, during production of buffer layers in thin-film solar cells, high substrate temperatures (>250° C.) are often harmful, since at relatively high temperatures thin layers already mix largely by diffusion and chemical reactions with the semiconductor material under them. In the case of co-evaporation, the arrangement of the sources must be precisely defined. In addition, the evaporation rates must be very precisely defined in order to fine-tune the composition of the deposited layer with accuracy in the single-digit percentage range homogeneously on large surfaces. Compound semiconductors can also be produced by sputtering or thermal evaporation of the compound out of the scoop, out of effusion cells, out of linear evaporators, or with the electron beam. In this case, the composition of the layer must be fine-tuned by the composition of the starting material and by process parameters. Experiments with zinc oxide, zinc magnesium oxide, cadmium sulfide, zinc sulfide, or indium sulfide, for example, are known. Here, better results in layer formation are obtained than with the use of co-evaporation, in particular at low temperatures. However, difficulties arise with regard to reproducibility as well as long-term stability of the deposition. In particular, the starting material has a clear influence on the reproducibility and the efficiency of the solar cells. It is difficult to evaporate the correct composition out of compound material to ensure suitable layer formation. The control of the layer composition via the composition of the material or via evaporation parameters such as source temperature or source geometry is critical when a component of the source material becomes depleted. Then, the long-term stability of the process cannot be ensured. Oxidic compound semiconductors such as ZnO, ZnMgO, InSnO (ITO), and the like are often produced by sputtering or electron beam evaporation (e-beam evaporation) of targets made of appropriate multicomponent compounds. In this case, a deviation of the layer composition due to oxygen loss is usually observed. This oxygen loss can be compensated by addition of oxygen gas. The composition of the layer can also be fine-tuned via the composition of the target material. In the case of sputtering, the composition can also be fine-tuned to a small extent by the sputter pressure. However, that does not result in a long-term stable process because one component then becomes enriched in the target.

Consequently, an object of the invention is to provide a device and a method for depositing a layer made of at least two components on an object, with which a deposition, i.e., a deposition process, can be selectively controlled. A thin-film (thin layer) solar module should further be provided. This object is accomplished by means of devices and a method with the characteristics of the coordinated claims. Advantageous embodiments of the invention are reported through the characteristics of the subclaims.

In particular, the object is accomplished by means of a device for depositing a layer made of at least two components, in particular a thin layer, on an object, in particular on a substrate, wherein the device comprises the following:

a deposition chamber, in which the object can be or is disposed, at least one source with material to be deposited, which can be or is disposed, in particular in the deposition chamber ("can be disposed" can also be understood to mean "can be provided"), at least one device for controlling the deposition process, implemented such that by means thereof at least the concentration of at least one component of the material to be deposited can be modified in its gas phase and thus prior to its deposition on the object, in particular on the substrate, by selective binding of a specified quantity of the at least one component, such that the deposition occurs in a controlled manner.

The device for controlling the deposition process is implemented such that the selectively bound quantity of the at least one component can be controlled or modified by modifying at least one control parameter that is actively coupled to a binding rate of the device for the at least one component. As already stated in the introduction, the binding rate of the device for depositing describes the quantity of a selectively bound component that is extracted from the gasphase by a reactive or inner surface per unit of time. The binding rate depends on a binding capacity and/or the size of the binding surface.

An essential point of the invention resides in the fact that, with the device (and also with the method), control or regulation of the layer composition during deposition of layers made of multiple components, in particular on a substrate, is possible. In the recipient (i.e., for example, evaporation chamber in the case of evaporation or sputter chamber in the case of cathode sputtering), the controlling device operates with defined parameters; the deposition chamber is thus implemented such that deposition occurs selectively or in a controlled manner because the concentration of at least one component of the material to be deposited is selectively modified by early "capture". "In a controlled manner" thus means the components of the material to be deposited are selectively influenced in their concentration (at least one of the components) in order to define the rate of deposition on the object. It is, of course, also possible to influence multiple components selectively as desired before deposition on the substrate, i.e., for example, to modify their concentrations. With the device (and also with the method), at least one layer can be deposited, for example, on an object, in particular on a substrate, and thus, for example, a layer stack or multilayer body can be produced. The object according to the invention is, in particular, useful in the case of evaporation out of the compound. It is also, however, advantageous with co-evaporation to be able to control the rate of deposition by an additional parameter besides the evaporation rate of the individual elements. The invention is applicable for all coating methods, in particular in PVD methods and, there, in particular, with thermal methods from scoops, crucibles, effusion cells, linear sources, etc. Other methods with layer deposition by PVD are electron beam evaporation, magnetron sputtering, ion beam ablation, or laser beam ablation. However, applications with other methods for deposition of thin layers (e.g., CVD, chemical vapor deposition) are also conceivable. These layers can be deposited with this method on extremely varied objects, in particular, on substrates. The rate of deposition can be controlled or regulated by various parameters, as are described in detail hereinafter. The object according to the invention is thus suitable for a long-term stable process, in particular, when the desired layer composition deviates only a few percent from the respective momentarily available composition of the starting material. Thus, the structure of the processing system and the process control can be designed substantially simpler than has previously been possible.

In the following, for the most part, the chemical symbols for specific elements will be indicated, for example, "Mo" for molybdenum or "Se" for selenium.

Advantageously, in the device according to the invention for depositing a layer made of at least two components on an object, the device for controlling the deposition process is implemented such that the selectively bound quantity of the at least one component can be controlled (even) during the deposition process of the component. This measure enables selective influence on the layer composition even during the depositing of the layer. It can further be of particular advantage in the device according to the invention for the device for controlling the deposition process to be implemented such that the selectively bound quantity of the at least one component can be controlled without modification of a negative pressure generated in the deposition chamber. This measure advantageously enables control or modification of the composition of the deposited layer without breaking the negative pressure or vacuum such that the production of layers can occur substantially easier and faster. In addition, it is possible to prevent foreign substances from undesirably penetrating into the deposition chamber due to a break in the vacuum, which can negatively affect the composition (purity) of layers produced.

In another preferred embodiment, the controlling device has at least one gettering element made of a (chemically) reactive material that is disposed in the deposition chamber and is implemented such that the concentration of the at least one component (of the material to be deposited) can be modified by chemical binding of a specified quantity of the component to the gettering element (and thus prior to the actual deposition as a layer on the substrate). In other words, by selective or targeted binding of gas particles (molecules, atoms, and/or ions) of the material to be deposited by at least one gettering element that has a material chemically reactive against the at least one component to be controlled, the composition of the layer to be deposited (and, thus, the deposited layer) is modified in the gasphase compared to the composition of the starting material. The layer formation can accordingly be regulated in a controlled manner.

Preferably, the controlling device can also have at least one gettering element, preferably made of a material (chemically) inert against the at least one component to be controlled that is disposed in the deposition chamber and that is implemented such that the concentration of the at least one component can be modified by physical binding of a specified quantity of the component to the gettering element. Here, the selective binding can occur, for example, by condensation or adsorption (control primarily by the temperature of the gettering surface, cf. below). In other words, one or a plurality of bodies are situated in the chamber, onto which a component of the vapor (or even plasma) is selectively bound (i.e., for example, purposefully selected) by a chemical or physical reaction. This creates a difference between the composition of the vapor in the chamber and the composition of the layer. The gettering element is implemented with defined properties such that the deposition thereon and thus also on the substrate occurs in a defined manner and, thus, selectively. The material to be deposited will be deposited—depending on the design of the environment—substantially everywhere, even on the gettering element or the gettering elements. Thus, a specific proportion of the material to be deposited is "taken away" before the actual deposition on the substrate. In other words, the gettering element (or, optionally, a plurality of gettering elements) serves to modify the chemical composition of the vapor and/or a plasma. Thus, the composition of the layer on the substrate can be fine-tuned variably. The binding of gas particles onto the gettering material can be reversible or irreversible. With a reactive gettering material, an irreversible binding is usually achieved; and the gettering element must, for example, be replaced or regenerated from time to time.

Preferably, the gettering element is implemented from copper and/or molybdenum or another element suitable for the respective compound, in order, in particular, to achieve chemical binding on the gettering element. In the case of evaporation of starting materials of the type $B_xC_y$, the proportion y can be reduced by the use of gettering surfaces in the evaporation chamber. Copper is particularly well-suited for the binding of sulfidic or selenidic components. Consequently, with the device according to the invention, especially compounds such as $Cu_2S$, $In_2S_3$, $InS$, $GaS$, $Ga_2S_3$, $Al_2S_3$, $CuInS_2$, $CuGaS_2$, $CuAlS_2$, $CuIn_5S_8$, $Cu_2Se$, $In_2Se_3$, $GaSe$, $Ga_2Se_3$, $Al_2Se_3$, $CuInSe_2$, $CuGaSe_2$, $CuAlSe_2$, $CuIn_3Se_5$, $SnSe$, $SnSe_2$, $ZnSe$, $SnS$, $SnS_2$, $ZnS$, $Cu_2SnS_3$, $CdS$, $CdSe$, $CdTe$, $Cu_2ZnSnS_4$, $Cu_2ZnSnSe_4$, or other compounds, in particular other selenium-, sulfur-, or tellurium-containing compounds can be used. Both copper and molybdenum preferably bind Se or S or Te. Thus, the layer deposited or to be deposited on the object or substrate becomes depleted with regard to these elements such that control of the precise composition of the deposited layer becomes possible. Even in the case of deposition of oxidic compounds, it is possible, for example, to control the oxygen content of the layer by means of the reactive binding of oxygen on gettering surfaces made, for example, of Ti.

In another preferred embodiment, the gettering element is disposed as an element per se in the deposition chamber and/or forms at least a part of the deposition chamber, in particular at least a part of a deposition chamber wall. The gettering element can thus be disposed at a location provided therefor in the deposition chamber and is thus also easily removable therefrom. For example, the gettering element can be disposed in an optionally forming vapor lobe and thus have an influence on the gas phase and, with it, the layer formation. It is also possible to form the walls of the deposition chamber from the desired gettering material (at least partially) or to provide a wall lining (likewise, at least partially) made of the gettering material (space saving).

Preferably, the controlling device includes at least one masking element that is implemented such that an active region of the gettering element is variable. In other words, the surface of the gettering element exposed to the vapor is variable. The masking element is disposed such that it, for example, partially covers the gettering element or enlarges the active region. If the masking element is (or, optionally, if the masking elements are) completely retracted, the entire surface of the gettering element, for example, can function. For this, the masking element or the masking elements is/are formed from an inert material (such that a gettering function is, in principle, avoided). Bellows, movable covers, and the like devices can, for example, be provided as masking elements. The active surface (binding surface) of the gettering element, whose size can be modified here by one or a plurality of masking elements, thus serves as a variable control parameter to control the binding rate for selective binding of at least one component of the layer to deposited.

In an advantageous embodiment, the controlling device has at least one device for temperature control or regulation, implemented such that the temperature at least of the active region of the active region of the gettering element and/or of the object, in particular of the substrate, can be controlled. The device can, for example, be provided as a source heating device and/or substrate heating device or can include these. The temperature of the gettering element affects the getter rate and thus serves as a variable control parameter for controlling the binding rate of the selective binding of at least one component of the layer to deposited.

The extent of the condensation (in this case, physical binding) of a component (i.e., of a specified quantity of gas particles on the gettering element) and, thus, the composition of the layer on the substrate can be controlled by means of the temperature of the gettering surface. Alternatively, the substrate temperature is suitable here as a different or even as an additional parameter for controlling the rate of deposition. By means of a variation of this temperature, the getter rate is either increased or reduced, depending on the selection of the reactants. An increase in the temperature can result in an increase in the gettering function or even to a higher probability of re-emission from the hotter surface back into the deposition chamber and thus to a reduced gettering function. However, in both cases, the rate of deposition and/or binding can be controlled from the outside by means of a variable process parameter. Then, in a production process, the surface can be regenerated at regular maintenance intervals by heating. Alternatively, the temperable surfaces (panels, films, meshes, or the like) can be exchanged and replaced by fresh uncoated surfaces. Moreover, the reaction speed of the component to be bound can be influenced by the temperature of a non-inert gettering surface (in this case chemical binding). For example, in the case of a copper surface in a sulfur-containing atmosphere, by increasing the temperature of the copper, the speed of the sulfur corrosion (e.g., increase in sulfur binding on the copper surface) can be accelerated, as a result of which, during a deposition process, less sulfur can be incorporated into the layer.

Preferably, the controlling device has at least two gettering elements that are implemented as electrode elements and to which different electrical potentials can be applied such that two differently configured gettering elements are provided, which, optionally, enable different binding rates (deposition on the gettering elements). It is also possible to connect a gettering element relative to the chamber wall such that the gettering element and the chamber wall are on different potentials. For this, an additional electrode can be provided that comprises the controlling device. For this, the controlling device would have to have appropriate switching elements such that the application of different potentials is enabled. A further capability of controlling the vapor composition from the outside could thus consist in laying, for example, two copper surfaces in the chamber to different electrical potentials. Depositions of differing thickness could be established on two surfaces that have a potential difference relative to each other. By means of a variation of the potential difference or even the electrode surface and its arrangement, the layer composition could likewise be actively controlled. Alternatively, the electrical potential of the Cu surface can also be modified relative to the chamber wall or to another electrode in the process chamber.

Provision is advantageously made for the controlling device to have at least one device for moving and/or positioning of the gettering element and/or of the masking element, implemented such that the gettering element and/or the masking element can be moved in the deposition chamber and thus the position of the gettering element and/or of the masking element can be varied. Thus, for example, the active region of the gettering element can be changed (e.g., by moving the gettering element behind a masking element and/or inside an optionally occurring vapor lobe). It is also possible to use moving for the exchange of the element. The moving of the masking element or a plurality of masking elements likewise enables modification of the active region of the gettering element or of the gettering elements. If this modification of the gettering element is, for example, a function of the radial distance from the axis of an effusion cell (or a sputtering cathode, etc.), it is conceivable to fine-tune the gettering function as a function of the distance from the evaporation axis. This function can, in principle, be used to eliminate possibly occurring inhomogeneities of the vapor lobe of different vaporizing species. This effect could also be used to enable large-area homogeneous coating in terms of layer composition.

Preferably, the gettering element is implemented as a panel element or a rod element since these can be placed easily and make an active region available in a suitable manner. The gettering element can also be provided as a film element, as a sheet element, as a grid element (one-dimensionally as a grate or two dimensionally as a mesh or screen, even with different mesh spacing in one or two directions within the lattice plane) or the like elements.

The gettering element is preferably implemented such that it at least partially encases the at least one source. For this, a cylinder shape is, for example, suitable, or the gettering element is implemented as a box element. Thus, the gettering element functions in close proximity to the vaporization site (source).

Preferably, the following compounds can be deposited with the device:
all multicomponent compounds,
   in particular II-VI-, III-V-, $III_2VI_3$-, I-III-$VI_2$-, I-$III_3$-$VI_5$-, I-$III_5$-$VI_8$-, $I_2$-II-IV-$VI_4$-compounds, wherein the Roman numerals I through VI refer to corresponding groups of the periodic system of the elements, in particular all compounds with oxygen, sulfur, selenium, or tellurium, in particular compounds such as $Cu_2Se$, $In_2Se_3$, $GaSe$, $Ga_2Se_3$, $Al_2Se_3$, $CuInSe_2$, $CuGaSe_2$, $CuAlSe_2$, $CuIn_3Se_5$, $Cu_2S$, $In_2S_3$, $InS$, $GaS$, $Ga_2S_3$, $Al_2S_3$, $CuInS_2$, $CuGaS_2$, $CuAlS_2$, $CuIn_5S_8$, $SnSe$, $SnSe_2$, $ZnSe$, $SnS$, $SnS_2$, $ZnS$, $Cu_2SnS_3$, $CdS$, $CdSe$, $Cu_2ZnSnS_4$, $Cu_2ZnSnSe_4$, or $CdTe$.

In other words, the gettering element is implemented such that these compounds are particularly well-suited for the deposition process and for layer deposition on the object or on the substrate.

The invention also extends to a device for depositing a layer made of at least two components on an object, with a deposition chamber for disposing the object, at least one source with material to be deposited, as well as at least one device for controlling the deposition process, implemented such that the concentration of at least one component of the material to be deposited can be modified in its gas phase prior to deposition on the object by selective binding of a specified quantity of the at least one component, wherein the device for controlling the deposition process has at least one gettering element made of a reactive material that is arranged in the deposition chamber and is implemented such that the concentration of the at least one component can be modified by chemical and/or physical binding of a specified quantity of the component to the gettering element, wherein the reactive material includes copper and/or molybdenum or one or a plurality of compounds thereof. Advantageously, this device is implemented such that the selectively bound quantity of the at least one component can be controlled by modifying at least one control parameter actively coupled to a binding rate for the at least one component, wherein, for this purpose, the device for controlling the deposition process can be implemented such that a temperature and/or an active binding surface and/or an electrical potential of the gettering element can be modified.

The invention also extends to a method for depositing a layer made of at least two components on an object, wherein the concentration of at least one component is modified in its gas phase prior to deposition on the object by selective binding of a specified quantity of the component by means of a device for controlling the deposition process, wherein the selectively bound quantity is controlled by modifying a binding rate for the component of the device for controlling the deposition process. In an advantageous embodiment of the method according to the invention, the selectively bound quantity of the at least one component is controlled by modifying a temperature and/or an actively binding surface and/or an electrical potential of a gettering element. In another advantageous embodiment of the method according to the invention, a different electrical potential is applied on at least two gettering elements that are implemented as electrode elements, in order to selectively control the composition of the deposited layer as desired. In another advantageous embodiment of the method according to the invention, a different electrical potential is applied to the at least one gettering element relative to the wall of the deposition chamber in order to selectively control the composition of the deposited layer as desired. In another advantageous embodiment of the method according to the invention, a different electrical potential is applied to the gettering element relative to at least one other electrode in order to selectively control the composition of the deposited layer as desired. In another advantageous embodiment of the method according to the invention, the at least one gettering element and/or a masking element for the gettering element is moved in the deposition chamber, and, thus, the position of the gettering element and/or of the masking element is varied in order to selectively control the composition of the deposited layer as desired.

The invention also relates to a method for depositing a layer made of at least two components, in particular a thin layer, on an object, in particular on a substrate, with a device comprising the following:

a deposition chamber and at least one source with material to be deposited, which can be or is disposed, in particular, in the deposition chamber, and at least one device for controlling the deposition process, wherein the method comprises the following steps:

Arranging the object, in particular the substrate, in the deposition chamber,

Controlling the deposition process by means of the at least one controlling device such that by means thereof at least the concentration of at least one component of the material to be deposited can be modified in its gas phase and thus prior to its deposition on the object, in particular on the substrate, by selective binding of a specified quantity of the at least one component, such that the deposition process occurs in a controlled manner.

Preferably, the controlling device comprises at least one gettering element made of a reactive material that is disposed in the deposition chamber. Preferably, the additional step is provided: Modification of the concentration of the at least one component by means of the gettering element made of the (chemically) reactive material, by chemical binding of a specified quantity of the component to the gettering element. Likewise, the controlling device preferably has at least one gettering element made of an inert material that is disposed in the deposition chamber, and, preferably, the additional step is provided: Modification of the concentration of the at least one component by means of the gettering element made of the (chemically) inert material, by physical binding of a specified quantity of the component to the gettering element.

As already described above, the vaporizing material, in other words, the concentration of the material (at least of one component of the material being vaporized and to be deposited), can be selectively modified by the physical or chemical binding of gas particles to the gettering material, in order to thus be able to cause the layer formation process on the object, in particular on the substrate, to proceed in a controlled or regulated manner. For this, the additional step of the modification of an active region of the gettering element by means of at least one masking element of the controlling device can, preferably, also be provided. Preferably, the step of the control of the temperature can also be provided, meaning the temperature of at least the active region of the gettering element and/or of the object, in particular of the substrate, by means of a device for temperature control or regulation of the controlling device. The modification of the active region of the gettering element and/or the modification of the temperature of the active region or even of the temperature of the substrate are likewise measures to cause the layer formation process on the substrate to proceed selectively and to influence it purposefully, since a different temperature of the gettering element and/or of the substrate causes a different binding of a component on the gettering element and also a different depositing of the component or the components onto the substrate. Also suitable is the additional step of the application of different electrical potentials to two gettering elements in order to control the deposition process onto the substrate (in that the concentration of material to be deposited is thus influenced, i.e., is modified in the gas phase). For this, the controlling device now includes at least two gettering elements that are implemented as electrode elements and that can be connected accordingly. A gettering element can also be connected to the deposition chamber wall or to an additional electrode such that the gettering element and wall or gettering element and additional electrode are on different potentials.

Preferably, the additional step is provided: Moving (modifying the position) of the gettering element and/or of the masking element in the deposition chamber and, thus, modification of the active region of the gettering element by means of a device for moving and/or positioning the gettering element and/or the masking element of the controlling device. This enables the desired placement of the gettering element and/or of the masking element at a location suitable for action on the material to be deposited and also the positioning for the modification of the active region of the gettering element. And finally, it can be advantageous to provide the following additional step: Encasing the source of the device by means of the gettering element. Preferably, the following step is provided: Depositing the following compounds (in other words, all these components can be selectively deposited with the method according to the invention):

all multicomponent compounds,
- in particular II-VI-, III-V-, $III_2VI_3$-, I-III-$VI_2$-, I-$III_3$-$VI_5$-, I-$III_5$-$VI_8$-, $I_2$-II-IV-$VI_4$-compounds,
- in particular all compounds with oxygen, sulfur, selenium, or tellurium,
- in particular compounds such as $Cu_2Se$, $In_2Se_3$, GaSe, $Ga_2Se_3$, $Al_2Se_3$, $CuInSe_2$, $CuGaSe_2$, $CuAlSe_2$, $CuIn_3Se_5$, $Cu_2S$, $In_2S_3$, InS, GaS, $Ga_2S_3$, $Al_2S_3$, $CuInS_2$, $CuGaS_2$, $CuAlS_2$, $CuIn_5S_8$, SnSe, $SnSe_2$, ZnSe, SnS, $SnS_2$, ZnS, $Cu_2SnS_3$, CdS, CdSe, $Cu_2ZnSnS_4$, $Cu_2ZnSnSe_4$, or CdTe.

Protection is likewise claimed for a thin-film solar module or a thin-layer solar module with a layer stack (multilayer body, e.g., substrate with a layer or layers deposited thereon), wherein the layer stack or at least one layer of the layer stack is or was produced with the above-described method.

The invention further extends to the use of such devices and such a method for depositing a layer made of at least two components on an object for the production of a thin-layer solar cell or a thin-layer solar module that preferably includes, as a semiconductor layer, a chalcopyrite compound, in particular $Cu(In,Ga)(S,Se)_2$. Preferably, the use serves for the production of a CIS- or (CIGSSe) thin-layer solar cell or of a CIS or (CIGSSe) thin-layer solar module.

It is understood that the various embodiments of the objects of the invention can be realized individually or in any combinations. In particular, the above mentioned characteristics and those to be explained in the following can be used not only in the combinations indicated but also in other combinations or alone, without departing from the framework of the present invention.

In the following, the invention is described with reference to exemplary embodiments that are explained in detail with reference to the drawings.

Figure 1:
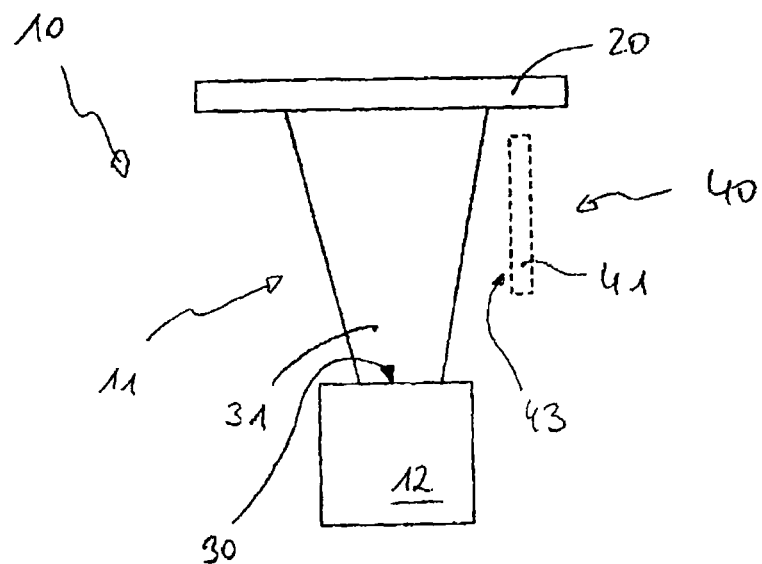
FIG. 1 is a schematic plan view of the device according to the invention in one embodiment.

FIG. 1 depicts a device 10 for depositing a layer made of at least two components, in particular a thin layer, on an object, in particular on a substrate 20. A schematic plan view is depicted. The arrangement comprises a deposition chamber 11 (not explicitly specified) and a source 12 (here, an evaporator) with material to be deposited 30 that is disposed in the deposition chamber 11. In this system 10, a substrate 20 or a plurality of substrates (or, generally speaking, objects) that are to be coated can be disposed. For the coating, the material to be deposited 30 (not visible in the source) must, for example, be evaporated. For this, the material to be deposited 30 is heated, e.g., in the source 12 (thermal evaporation) and thus deposits on objects in the environment. Between the source 12 and the substrate 20, a vapor lobe 31 that is formed by the material to be deposited 30 in the gas phase is discernible. Other gas formation methods can likewise be used. The device (and also the corresponding method) can be used in layer deposition by PVD or even by CVD methods. Sputtering cathodes, effusion cells, crucibles (depending on the method used) can also be provided as sources.

The composition of the layer that is to be deposited on the substrate 20 can be selectively influenced with this arrangement. For this, the device 10 comprises a device 40 for controlling the deposition process, implemented such that by means thereof at least the concentration of at least one component of the material to be deposited can be modified in the gas phase and thus prior to its deposition by selective binding (on an object other than the substrate) of a defined quantity of the at least one component, such that the deposition onto the substrate 20 occurs in a controlled manner. In concrete terms, a body, here, a gettering element 41, onto which a component of the vapor binds by a chemical or physical reaction is situated in the chamber 11 (i.e., in the evaporation chamber in the case of evaporation or sputter chamber in the case of cathode sputtering). This creates a difference between the composition of the vapor directly at the source 12 and the composition of the layer. Here, the gettering element is depicted by dashed lines, for better differentiation from the other components. The material is thus also deposited on the gettering body or on the gettering element 41. Since the gettering element 41 is implemented with specified parameters or defined properties, the deposition of particles of the material to be deposited onto the substrate 20 also occurs selectively. Depending on the getter material, the material to be deposited binds physically or chemically to the gettering element 41.

The binding rate on the gettering element 41 can be controlled by the size of the surface of the active area or of the active region 43 of the gettering element or by other physical parameters such as the temperature or an additional electrical potential. The binding on the gettering element 41 can be reversible or irreversible.

The layers can be deposited with the device according to the invention and the method according to the invention onto various substrates. The substrates can be implemented both flexible (e.g., polymer films or metal foils) and rigid (e.g., ceramic, glass).

Figure 2:
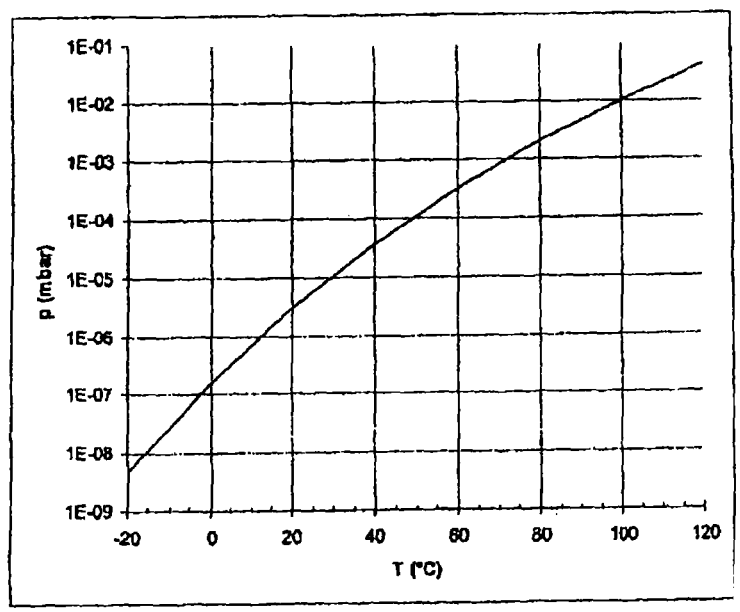
FIG. 2 is a vapor pressure curve of sulfur.

Physical binding (e.g., adsorption) on the gettering element 41 can, for example, be controlled via the temperature of an inert surface (of the gettering element) in the evaporation chamber. FIG. 2 depicts, by way of example, the vapor pressure curve of sulfur. The temperature is plotted on the abscissa in ° C.; the vapor pressure, on the ordinate in mbar. Through variation of the temperature (even of a chemically inert gettering element) in the range from −20° C. to 20° C., the vapor pressure of sulfur varies by more than three orders of magnitude. The vapor pressure in the gas compartment between the source and the substrate can be significantly influenced over a large surface in the evaporation chamber. Sulfur will condense on the surfaces according to the temperature. The gettering element can also have a chemically reactive region or be formed from a chemically reactive material, e.g., from copper (Cu surface). Here, the concentration of the at least one component is modified by chemical binding of a specified quantity of the component on the gettering element.

Figure 3:
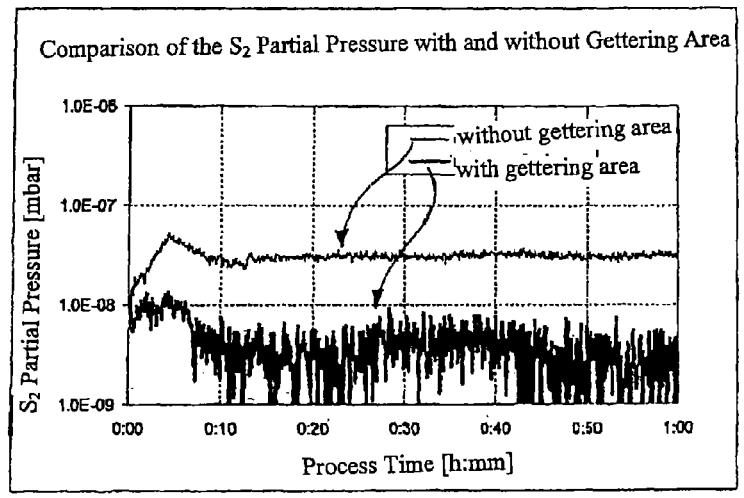
FIG. 3 is a graph with measurement curves of a $S_2$-partial pressure.

FIG. 3 shows a graph that represents the curves of a $S_2$-partial pressure over time in a chamber, recorded in a device for depositing with and without a gettering element. For this, a multicomponent, sulfur-containing compound was deposited on a substrate. The process time is plotted in hours and minutes on the abscissa; the $S_2$-partial pressure, on the ordinate in mbar. The layer composition of the deposited layer on the substrate was determined by x-ray fluorescence analysis. It was shown that the incorporation of a copper foil (as a gettering element) reduces the relative sulfur content of the deposited layer by roughly 3% (in order to influence the composition of the layer, the inside face of the chamber wall of the deposition chamber or the coating chamber was lined with relatively large areas of the above-mentioned copper foil). A residual gas analyzer situated in the system was used to determine the sulfur partial pressure. It can be seen that through the presence of the copper surface, the $S_2$-partial pressure decreased by an order of magnitude. This affects the layer composition of the deposited layer.

Figure 4:
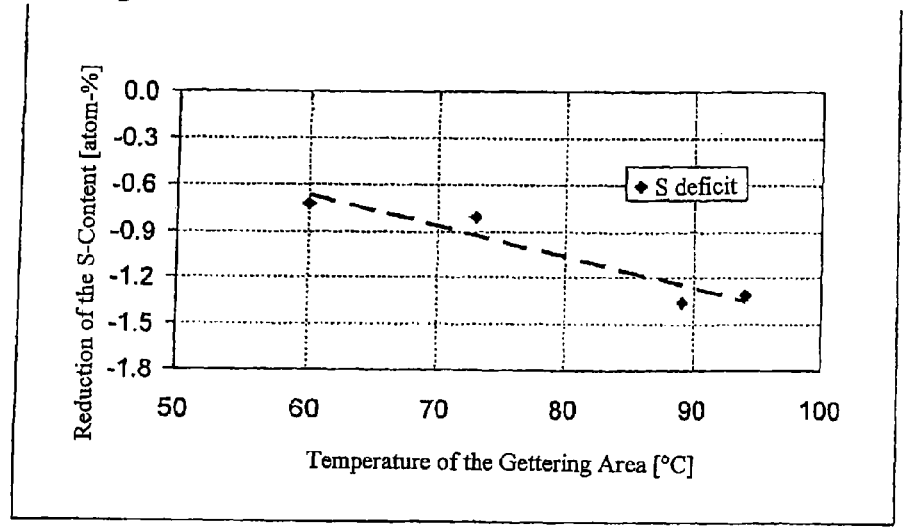
FIG. 4 is a graph depicting a curve of the S-content within a thin layer.

In further experiments, the Cu-surfaces introduced (or gettering elements) were heated. FIG. 4 depicts the curve of the S-content within a thin layer plotted against the temperature of the gettering element. The temperature of the gettering element is plotted in ° C. on the abscissa; the reduction in the S-content in the deposited layer on the substrate, in atom-% on the ordinate. In this case as well, the layer was produced by deposition of a sulfur-containing, multicomponent compound. It can be seen that the sulfur content in the layer decreases due to heating of the above described Cu-surfaces; in other words, the gettering function of the foil increases due to heating.

Figure 5:
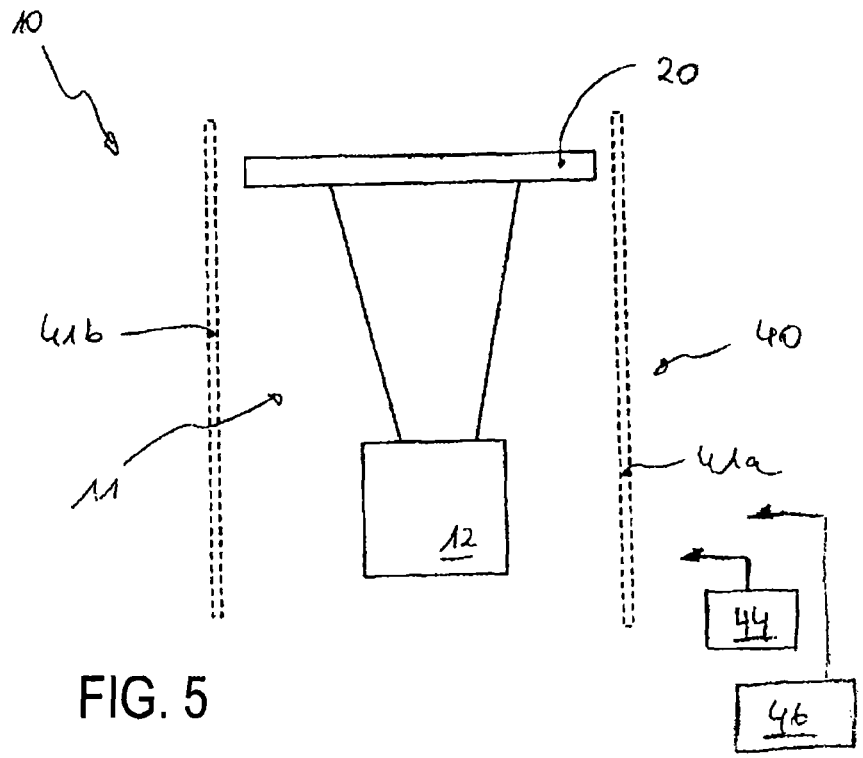
FIG. 5 is a schematic plan view of the device according to the invention in another embodiment.

FIG. 5 depicts, in a schematic plan view, another embodiment of the device according to the invention 10 for depositing a layer on an object 20. It is constructed similar to that depicted in FIG. 1. However, in this case, two gettering elements 41a, 41b that are installed as panels (also sheets, foils, etc.) on the chamber walls are provided. The entire wall of the deposition chamber 11 (side walls, floor, and/or ceiling) or only subregions thereof can be used for this, depending on the desired effect of the gettering element or the gettering elements 41a, 41b. The panels 41a, 41b can be heated, cooled, or have different electrical potentials relative to each other or relative to the chamber wall or to another electrode. For this, corresponding elements or devices would have to be provided. Thus, the controlling device 40 can have at least one device 44 for temperature control and/or regulation. This is presented here as a "black box" and the device 44 appears schematically in outline. Here, the controlling device 40 would have appropriate control elements for operation of the device 44. The device 40 can also have a device 46 connecting the gettering elements 41, 41b, with which the above described potential allocation is enabled. The device 46 thus permits the connection of the two gettering elements, optionally, also the connection of a gettering element to the wall of the deposition chamber or to an additional electrode.

Figure 6:
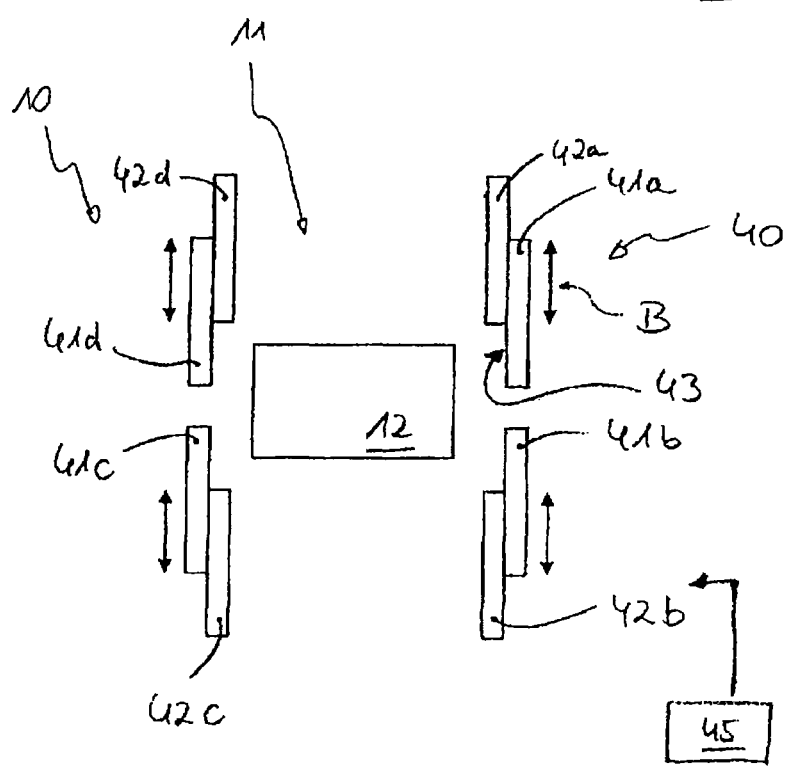
FIG. 6 is a schematic plan view of the device according to the invention in another embodiment.

FIG. 6 depicts another embodiment of the device according to the invention (schematic top plan view, without depicting the substrate), wherein, in this case, four gettering elements 41a, 41b, 41c, 41d are provided. Each of these gettering elements can be covered by means of a masking element 42a, 42b, 42c, 42d. In other words, each of the masking elements is, for example, movable (in the direction of the arrow B) such that an active surface region 43 (sketched only as gettering element 41a) of each gettering element 41a, 41b, 41c, 41d is variable. The gettering elements can also be designed to be movable. For this, a device 45 for moving and/or positioning the gettering element and/or the (respective) masking element can be provided. The device 45 is, again, presented here only schematically as a "black box" and is intended to indicate that the controlling device 40 can have the moving device 45. The device 45 could, for example, have rail elements, in which the masking elements and/or even the gettering elements would be movable, manually or automatically. The devices 44, 45 and 46 can be provided in any of the embodiments depicted, wherein the controlling device 40 is implemented with appropriate control devices or wherein the gettering elements have appropriate connector sockets, etc.

Figure 7:
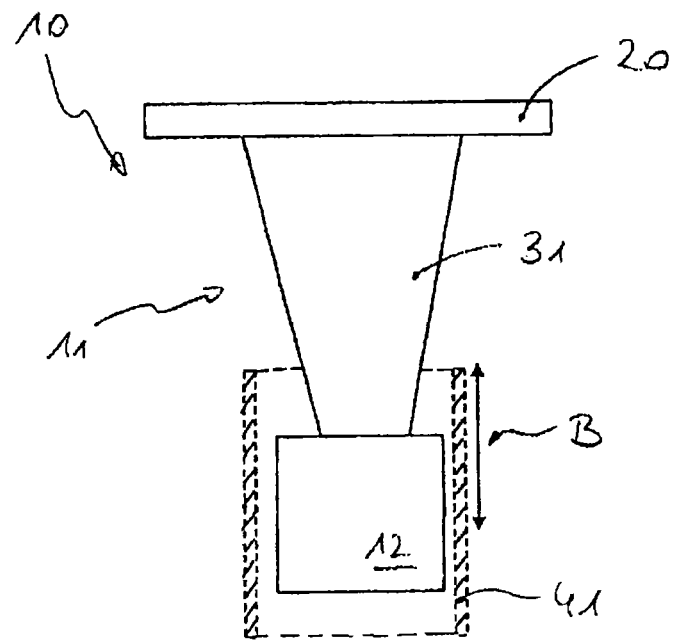
FIG. 7 is a schematic plan view of the device according to the invention in another embodiment.

FIG. 7, as well, depicts a schematic plan view of an another embodiment of the device according to the invention 10. This is, again, constructed similar to that depicted in FIG. 1; however, the source 12 is, for example, an effusion cell. Here, a gettering element 41 is disposed around the source 12. The gettering element 41 is here, for example, cylindrical (consequently, a cross-section is depicted), but it can also be elliptical, rectangular, hexagonal, etc. the encasing gettering element 41 can be heated, cooled, or have a different electrical potential in divisions. By moving the encasing gettering element (e.g., the encasing gettering cylinder) along the arrow B, the actual active surface can be modified.

Figure 8:
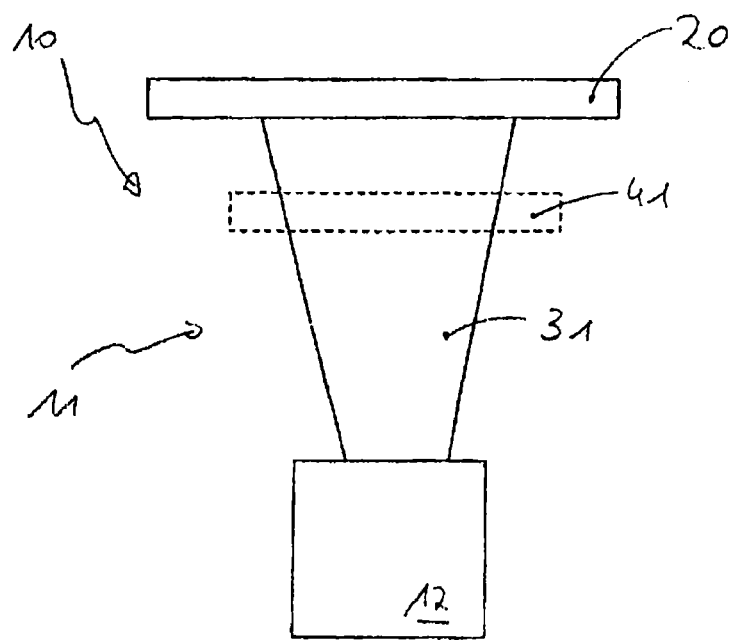
FIG. 8 is a schematic plan view of the device according to the invention in another embodiment.

FIG. 8 depicts another embodiment of the device according to the invention (schematic plan view), similar to those previously described. The source 12 is, again, an evaporator source. However, here, a grid-like gettering element 41 is disposed in the vapor lobe. The mesh (one-dimensionally as a grate or two dimensionally as a mesh or screen) thus lies in the vapor "beam". The grid element can likewise be heated, cooled, or have a different potential (relative, for example, to the chamber wall). In an alternative embodiment, the area of the grid element can be varied by modifying the mesh spacing.

Figure 9:
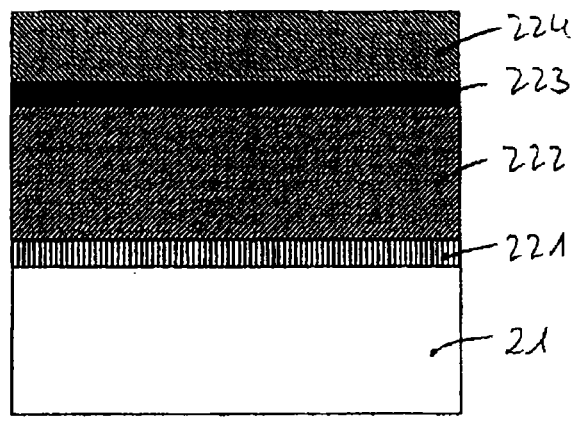
FIG. 9 is a layer stack of a thin-film solar cell.
Figure 10:
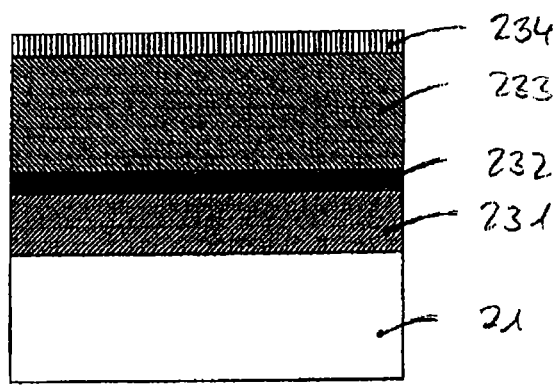
FIG. 10 is another layer stack of a thin-film solar cell.

FIGS. 9 and 10 depict coated substrates 20, as can be produced with the device according to the invention 10 or with the method according to the invention. FIG. 9 depicts a layer stack of a thin-film solar cell based on Cu(In, Ga) $(S,Se)_2$-absorber. The "naked" substrate 21 can, for example, be formed from glass, Fe, Al, or plastic film, optionally, with a diffusion barrier. A Mo-layer 221 is deposited on the substrate. Following that, the Cu(In,Ga)$(S,Se)_2$-layer 222, next a buffer layer 223, and, finally, for example, a TCO-layer (transparent conductive oxide layer) 224, e.g., ZnO:Al. Instead of the Cu(In,Ga)$(S,Se)_2$-layer, it is also possible to provide a $Cu_2ZnSn(S,Se)_4$-layer, a $Cu_2ZnSnS_4$-layer, or even a $Cu_2ZnSnSe_4$-layer. FIG. 10 depicts a layer stack of a thin-film solar cell, based on CdTe-absorber and CdS-buffer. The glass substrate 21 can, e.g., optionally be implemented with a diffusion barrier. There follows a TCO-layer (e.g., SnO/ITO, etc.) 231, a CdS-buffer layer 232, a CdTe-absorber layer 233, and, finally, an interface/metal contact 234.

With the object according to the invention, a component of a compound to be deposited on an object can be selectively modified in its concentration in a simple manner even prior to deposition such that the deposition process can be controlled and a defined layer is deposited on the object, in particular on the substrate. The device and the method are not restricted to substrate size and chamber size.

Further characteristics of the invention are revealed by the following description: The invention relates to a device for depositing a layer made of at least two components, in particular a thin layer, on an object, in particular on a substrate, comprising: a deposition chamber, in which the object can be disposed; at least one source with material to be deposited that can be or is disposed, in particular in the deposition chamber; at least one device for controlling the deposition process, implemented such that by means thereof at least the concentration of at least one component of the material to be deposited can be modified in its gas phase and, thus, prior to its deposition on the object, in particular on the substrate, by selective binding of a specified quantity of the at least one component such that the deposition occurs in a controlled manner. According to one embodiment, the controlling device has at least one gettering element made of a reactive material that is disposed in the deposition chamber and that is implemented such that the concentration of the at least one component can be modified by chemical binding of a specified quantity of the component to the gettering element. According to one embodiment, the controlling device has at least one gettering element, preferably made of an inert material that is disposed in the deposition chamber and is implemented such that the concentration of the at least one component can be modified by physical binding of a specified quantity of the component to the gettering element. According to one embodiment, the gettering element is disposed as an element per se in the deposition chamber and/or forms at least a part of the deposition chamber, in particular at least a part of a deposition chamber wall. According to one embodiment, the controlling device includes at least one masking element that is implemented such that an active region of the gettering element is variable. According to one embodiment, the controlling device has at least one device for temperature control and/or regulation, implemented such that the temperature at least of the active region of the active region of the gettering element and/or of the object, in particular of the substrate, can be controlled. According to one embodiment, the controlling device has at least two gettering elements that are implemented as electrode elements to which different electrical potentials can be applied such that two differently configured gettering elements are provided. According to one embodiment, the controlling device is implemented such that a different electrical potential can be applied to the gettering element relative to the deposition chamber wall. According to one embodiment, the controlling device has at least one electrode and is implemented such that a different electrical potential can be applied to the gettering element relative to this electrode. According to one embodiment, the controlling device has at least one device for moving and/or positioning of the gettering element and/or of the masking element, implemented such that the gettering element and/or the masking element can be moved in the deposition chamber and thus the position of the gettering element and/or of the masking element can be varied. According to one embodiment, the gettering element is implemented as a panel element or a rod element and/or as a grid element, and/or the gettering element is implemented such that it at least partially encases the source. According to one embodiment, the device is implemented such that the following compounds can be deposited:

all multicomponent compounds,
in particular II-VI-, III-V-, $III_2VI_3$-, I-III-$VI_2$-, I-$III_3$-$VI_5$-, I-$III_5$-$VI_8$-, $I_2$-II-IV-$VI_4$-compounds,
in particular all compounds with oxygen, sulfur, selenium, or tellurium,
in particular the following compounds: $Cu_2Se$, $In_2Se_3$, $GaSe$, $Ga_2Se_3$, $Al_2Se_3$, $CuInSe_2$, $CuGaSe_2$, $CuAlSe_2$, $CuIn_3Se_5$, $Cu_2S$, $In_2S_3$, $InS$, $GaS$, $Ga_2S_3$, $Al_2S_3$, $CuInS_2$, $CuGaS_2$, $CuAlS_2$, $CuIn_5S_8$, $SnSe$, $SnSe_2$, $ZnSe$, $SnS$, $SnS_2$, $ZnS$, $Cu_2SnS_3$, $CdS$, $CdSe$, $Cu_2ZnSnS_4$, $Cu_2ZnSnSe_4$, or $CdTe$.

The invention relates to a method for depositing a layer made of at least two components, in particular a thin layer, on an object, in particular on a substrate, with a device that comprises the following: a deposition chamber; at least one source with material to be deposited, which can be or is disposed, in particular in the deposition chamber; at least one device for controlling the deposition process, wherein the method comprises the following steps: Arranging the object, in particular the substrate, in the deposition chamber; controlling the deposition process by means of the at least one controlling device such that by means thereof at least the concentration of at least one component of the material to be deposited can be modified in its gas phase and thus prior to its deposition on the object, in particular on the substrate, by selective binding of a specified quantity of the at least one component, such that the deposition process occurs in a controlled manner. According to one embodiment, the controlling device has at least one gettering element made of a reactive material and/or of a preferably inert material that is disposed in the deposition chamber, wherein the method includes the following step and/or the following steps: Modification of the concentration of the at least one component by means of the gettering element made of a reactive material, by chemical binding of a specified quantity of the component to the gettering element and/or modification of the concentration of the at least one component by means of the gettering element made of a preferably inert material, by physical binding of a specified quantity of the component to the gettering element. According to one embodiment, the controlling device has at least one device for temperature control and/or regulation, wherein the method includes the additional step: Controlling the temperature at least of the active region of the gettering element and/or of the object, in particular of the substrate, by means of the device for temperature control or regulation. According to one embodiment, the controlling device has at least one masking element and/or a device for moving and/or positioning the gettering element and/or the masking element, wherein the method includes the additional step and/or the additional steps: Modification of an active region of the gettering element by means of the at least one masking element and/or moving and/or positioning of the gettering element and/or of the masking element in the deposition chamber by means of the device for moving and/or positioning of the gettering element and/or of the masking element.

LIST OF REFERENCE CHARACTERS

10 Device for depositing
11 Deposition chamber, chamber
12 Source
20 Substrate, object in general
21 "Naked" substrate
221 Layer
222 Layer
223 Layer
224 Layer
231 Layer
232 Layer 233 Layer
234 Layer
30 Material to be deposited
31 Vapor lobe
40 Device for controlling the deposition process
41 Gettering element
41a Gettering element
41b Gettering element
41c Gettering element
41d Gettering element
42a Masking element
42b Masking element
42c Masking element
42d Masking element
43 Active region
44 Device for temperature control or regulation
45 Device for moving and/or positioning of the gettering element
46 Connection device
B Direction of movement mask and/or gettering element

The invention claimed is:

1. A method for depositing a layer comprising at least two components on an object, the method comprising:
selectively binding a specified quantity of at least one component with a control device, which controls the deposition process, to modify a concentration of the at least one component in its gas phase prior to deposition on the object,
wherein the control device comprises a gettering element,
the gettering element is made of a material different from the at least two components in the layer,
the selectively bound quantity is controlled by modifying a binding rate of the component of the control device, the selectively bound quantity of the at least one component is controlled by modifying an actively binding surface and/or an electrical potential of the gettering element, and
when the electrical potential of the gettering element is modified, the gettering element is an electrode.

2. The method of claim 1, wherein the object is a thin-film solar cell substrate.

3. The method of claim 1,
wherein the selectively bound quantity of the at least one component is controlled by modifying an actively binding surface of at least one gettering element being different from the at least two components in the layer.

4. The method of claim 1,
wherein the selectively bound quantity of the at least one component is controlled by modifying an electrical potential of at least one gettering element being different from the at least two components in the layer.

5. The method of claim 1,
wherein the selectively bound quantity of the at least one component is controlled by modifying an actively binding surface and an electrical potential of at least one gettering element being different from the at least two components in the layer.

6. The method of claim 1,
wherein the at least one gettering element comprises a material that is chemically inert to the at least one component.

7. The method of claim 1,
wherein the at least one gettering element comprises a material that is chemically reactive to the at least one component.

* * * * *